United States Patent [19]

Saitou

[11] Patent Number: 4,756,796

[45] Date of Patent: Jul. 12, 1988

[54] METHOD OF PRODUCING WAFER

[75] Inventor: Yuichi Saitou, Urawa, Japan

[73] Assignees: Misubishi Kinzoku Kabushiki Kaisha; Japan Silicon Co., Ltd., both of Tokyo, Japan

[21] Appl. No.: 917,726

[22] Filed: Oct. 10, 1986

[30] Foreign Application Priority Data

Oct. 23, 1985 [JP] Japan ................................ 60-236899

[51] Int. Cl.$^4$ ................................................ C03B 9/46
[52] U.S. Cl. ...................................... 264/162; 156/662; 29/DIG. 15; 51/283 R; 51/5 C; 65/61; 65/70; 437/225
[58] Field of Search ........................ 156/645, 662, 636; 29/583, 574, DIG. 15; 51/283 R, 5 C; 65/61, 70

[56] References Cited

U.S. PATENT DOCUMENTS

| | | | |
|---|---|---|---|
| 2,886,026 | 5/1959 | Stewart | 29/583 |
| 4,084,354 | 4/1978 | Grandia et al. | |
| 4,228,578 | 10/1980 | Lin et al. | 29/583 |
| 4,261,781 | 4/1981 | Edmonds et al. | 29/583 |
| 4,276,114 | 6/1981 | Takano et al. | 156/645 |
| 4,465,550 | 8/1984 | Lane. | |
| 4,554,717 | 11/1985 | Vig et al. | 156/645 |

OTHER PUBLICATIONS

The American Heritage Dictionary, Houghton Mifflin Co. Boston 2nd College ed. 1976, pp. 406 & 1359.
European Search Report EP 86 11 4697 10-02-87 Bracke P.P. J.L.

Primary Examiner—Kenneth M. Schor
Assistant Examiner—Lori-Ann Cody
Attorney, Agent, or Firm—Scully, Scott, Murphy & Presser

[57] ABSTRACT

There is disclosed a method of providing an elongated stock; producing a wafer comprising the steps of processing one end face of an elongated stock to form a first flat surface; cutting through one end portion of the stock transversely by a cutter to provide a slice of a predetermined thickness having opposite side faces defined respectively by the first flat surface and a cut surface subjected to the cutting; and processing the cut surface of the slice to form a second flat surface, using the first flat surface as a reference surface, thereby providing the wafer.

5 Claims, No Drawings

METHOD OF PRODUCING WAFER

BACKGROUND OF THE INVENTION

1. Field of the Invention

This invention relates to a method of producing a wafer such as a semiconductor wafer of silicon monocrystal and a wafer material of quartz.

2. Prior Art

In the manufacture of a wafer of a semiconductor material such as silicon and gallium arsenic as well as a thin substrate or wafer material of quartz, sapphire or the like, a rod-like stock is successively cut into slices to produce the wafers. Generally, the rod-like stock is cut by a cutter of the type having a thin cutter blade of an annular shape having an inner peripheral cutting edge. More specifically, the rod-like stock is introduced into the annular cutter blade in a direction perpendicular to the annular cutter blade, and then the rod-like stock is transversely moved relative to the annular cutter blade which rotates at a high speed about an axis thereof, so that the rod-like stock is brought into cutting engagement with the inner peripheral cutting edge and is cut to produce a slice serving as a wafer.

The wafer thus cut from the rod-like stock is slightly warped due to the inherent accuracy of the above-mentioned cutter, a variation in accuracy of attachment of the annular cutter blade and a variation in balance of cutting resistances offered respectively by opposite inner marginal portions of the annular cutter blade around the inner peripheral cutting edge. And, it has been desired to eliminate such warp. The degree of warp depends on the material of which the wafer is made and the thickness and diameter of the wafer, and generally such warp is on the order of several $\mu$m to several tens of $\mu$m. The warped wafer sliced from the rod-like stock has curved opposite side faces. Even if it is desired to process one of the opposite side faces of the warped wafer into a flat surface, using the other side face as a reference surface, this can not be done since the opposite side faces are curved. And, the warp can not be removed from the sliced wafer by lapping, etching and polishing. Therefore, the warp of the wafer, which develops when the wafer is cut from the rod-like stock by the annular cutter blade, adversely affects the dimensional accuracy of the final product. This problem is serious particularly where the semiconductor wafer has a relatively large diameter with a highly-densed circuitry fabricated thereon to provide an integrated circuit. Thus, the warp of the wafer presents an obstacle to a highly dense integrated circuit.

SUMMARY OF THE INVENTION

It is therefore an object of this invention to provide a method of producing a wafer of which warp is reduced to a minimum to markedly enhance the flatness of the wafer.

According to the present invention, there is provided a of producing a wafer comprising the steps of:

(a) providing an elongated stock;

(b) processing one end face of said stock to form a first flat surface;

(c) cutting through one end portion of said stock transversely by a cutter to provide a slice of a predetermined thickness having opposite side faces defined respectively by said first flat surface and a cut surface subjected to said cutting; and (d) processing said cut surface of said slice to form a second flat surface, using said first flat surface as a reference surface, thereby providing the wafer.

The end surface of the elongated stock is first processed into the flat surface before the slice is cut from the stock, and then the cut surface is processed into the flat surface, using the first flat surface as a reference surface. therefore, the warp of the resultant wafer is reduced to a minimun, thereby enhancing the flatness of the wafer markedly.

DESCRIPTION OF THE PREFERRED EMBODIMENT OF THE INVENTION

There is prepared an ingot or stock of a material such as silicon monocrystal in the form of a rod of a circular cross-section, and one end face of the rod-like ingot is processed into a flat surface with high accuracy by polishing, grinding or cutting. Then, the rod-like stock is cut by a cutter of the type having a thin cutter blade of an annular shape having an inner peripheral cutting edge around an inner periphery thereof. More specifically, the rod-like stock is introduced into the annular cutter blade in a direction perpendicular to the annular cutter blade, and then is transversely moved relative to the annular cutter blade which rotates at a high speed about an axis thereof, so that the rod-like stock is brought into cutting engagement with the inner peripheral cutting edge and is cut transversely to produce a slice of a predetermined thickness to provide a wafer. The slice has opposite side faces defined respectively by the aforesaid flattened surface and a cut surface subjected to the cutting by the annular cutter blade. The cut surface of the slice is not flat but is curved for the reasons mentioned above. The cut surface of the slice is then subjected to flattening as by polishing, grinding or cutting, using the aforesaid flattened surface as a reference surface. The opposite flat side faces of the resultant wafer are parallel. The flattening of the cut surface is carried out, for example, by mounting the slice on a vacuum chuck which holds the slice against movement by suction, and then processing the cut surface by a diamond tool into a flat surface. Thus, since one flat side face of the slice is used as a reference surface for effecting the flatting of the other side face of the slice, the other side face of the slice can be processed into a high flatness. In this manner, the wafer having substantially no warp and hence substantially no curved side faces is obtained. However, in the event that the wafer thus obtained has a slight warp due to either a difference in the amount of the flattening operation between the opposite side faces of the slice or a difference in the amount of strain of the opposite side faces developing during the flattening operation, such a slight warp can be removed by stress-relieving annealing or chemical etching, thereby improving the flatness of the opposite side faces of the wafer.

For carrying out the above processings to obtain the wafer having the opposite flat side faces, the cutter of the type described having the inner peripheral cutting edge and capable of a surface cutting, a surface grinding or a surface polishing may be arranged in series with a surface cutting machine, a surface grinding machine or a surface polishing machine so as to provide a processing line. Also, one or more of washing or rinsing steps may be arranged along the processing line so as to remove chips or cuttings produced from the stock and the slice, in which case one or more of drying steps may be provided along the processing line.

The invention will now be illustrated by way of the folling Examples:

EXAMPLE 1

There was prepared an ingot of silicon monocrystal in the orm of a cross-sectionally circular rod having a diameter of 150 mm. One end face of the rod-like ingot was ground by a diamond cutter into a flat surface having a surface roughness of 0.2 μm and a flatness of ±1 μm. Then, the rod-like ingot was transversely cut therethrough at one end portion thereof by a cutter to provide a slice of a thickness of 0.785 mm having opposite side faces defined respectively by the flat ground surface and a cut surface subjected to the cutting, the cutter having an annular cutter blade having around an inner periphery an inner peripheral cutting edge having a diameter of 235 mm and a thickness of 0.29 mm, the annular cutter blade being rotated about its axis to cut the ingot at a rate of 60 mm per minute. Then, the slice was mounted on and fixed to a vacuum chuck including a porous body of alumina, with the ground flat surface held against a flat mounting surface of the porous body by suction. Then, the cut surface of the slice was ground by a diamond tool into a flat surface, thereby providing a wafer having the flat opposite side faces. Thus, since the ground flat surface of the slice was held against the flat mounting surface of the porous body of the vacuum chuck, the ground surface served as a reference surface for flattening the cut surface of the slice. Then, each of the opposite flat side faces of the wafer thus obtained was chemically etched by an amount of 5 μm, using a mixed acid composed of hydrofluoric acid, nitric acid and acetic acid, so that the total amount reduced by the etching was 10 μm. Then, the wafer thus etched was rinsed with pure water and thereafter was dried. Then, the warp of the wafer thus obtained was measured. The warp of the wafer was not more than 3 μm.

For comparison purposes, 500 comparative wafers were prepared. Each comparative wafer was prepared by cutting an ingot made of the same material and having the same diameter as the above ingot, by the same cutter to produce a slice of the same thickness as the above slice, and then polishing the opposite side faces of the slice, subjected to the cutting, by a lapping machine to reduce the thickness of the slice by an amount of 40 μm, and then etching the opposite side faces of the slice by the above-mentioned mixed acid to reduce the thickness of the slice by an amount of 10 μm. 500 comparative wafers thus obtained were measured to determine their warp. The maximum warp was 17 μm while the minimum warp was 6 μm, and the average warp was 9 μm.

As is clear from the above, with the method according to the present invention, the warp of the wafer is kept to an extremely small value.

EXAMPLE 2

There was prepared an elongated block stock of synthetic quartz having a square cross-section each side of which was 130 mm long. One end face of the block stock was ground by a diamond cutter into a flat surface having a surface roughness of 0.3 μm and a flatness of 1 μm. Then, the block stock was transversely cut therethrough at one end portion thereof by the same cutter as described above in Example 1 to provide a slice of a thickness of 2.85 mm having opposite side faces defined respectively by the flat ground surface and a cut surface subjected to the cutting. Then, the slice was mounted on and fixed to the same vacuum chuck as described above in Example 1, with the ground flat surface held against the flat mounting surface of the porous body of the chuck by suction so as to serve a reference surface for flattening the cut surface of the slice, as described above in Example 1. Then, the cut surface of the slice was ground by a diamond tool into a flat surface, thereby providing a wafer having a thickness of 2.8 mm. Then, the warp of the wafer thus obtained was measured. The warp of the wafer was 1 μm.

For comparison purposes, a comparative wafer was prepared by cutting a block stock made of the same material and having the same shape as the above block stock, by the same cutter to produce a slice having a thickness of 2.9 mm, and then polishing the opposite side faces of the slice, subjected to the cutting, by a lapping machine into a thickness of 2.8 mm. The warp of the comparative wafer thus obtained was 5 μm.

As is clear from the foregoing, with the method according to the present invention, the accuracy of flatness is about five times greater in comparison with the conventional method.

What is claimed is:

1. A method for producing two or more wafers from an elongated stock whose length is many times greater than the thickness of each wafer, comprising the steps of:
   (a) providing an elongated stock having an end face with a warped surface due to a prior wafer slicing operation;
   (b) milling said one end face to remove stock material and to reduce the warp of the surface to form a flat end surface on said stock;
   (c) cutting transversely through said elongated stock adjacent said one end surface by a cutter to provide a slice of a predetermined thickness having opposite side faces defined respectively by said first flat surface and a cut surface created by said cutting step;
   (d) milling said cut surface of said slice to form a second flat surface, using said first flat surface as a reference surface to align said second flat surface, thereby providing the wafer with two flat surfaces.

2. A method according to claim 1, in which the wafer is subjected to stress-relieving annealing to improve the flatness of said first and second flat surface.

3. A method according to claim 1 wherein the step (b) of milling the end face of the stock comprises mechanically abrading said surface to remove stock and flatten said surface.

4. A method according to claim 1 wherein the step (b) of milling the end face of the stock comprises mechanically grinding said surface to remove stock and flatten said surface.

5. A method according to claim 1 wherein the step (b) of milling the end face of the stock comprises mechanically cutting said surface to remove stock and flatten said surface.

* * * * *